United States Patent
Chua et al.

(10) Patent No.: US 7,645,709 B2
(45) Date of Patent: Jan. 12, 2010

(54) METHODS FOR LOW TEMPERATURE OXIDATION OF A SEMICONDUCTOR DEVICE

(75) Inventors: Thai Cheng Chua, Cupertino, CA (US); James P. Cruse, Capitola, CA (US); Cory Czarnik, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/830,140

(22) Filed: Jul. 30, 2007

(65) Prior Publication Data
US 2009/0035952 A1 Feb. 5, 2009

(51) Int. Cl.
H01L 21/469 (2006.01)
(52) U.S. Cl. .......... 438/770; 438/785; 438/792; 438/E21.268; 438/E21.193
(58) Field of Classification Search ........... 438/758, 438/770, 792
See application file for complete search history.

(56) References Cited

U.S. PATENT DOCUMENTS

| | | | |
|---|---|---|---|
| 6,534,421 B2 | 3/2003 | Kakkad | |
| 6,929,700 B2 | 8/2005 | Tan et al. | |
| 6,958,112 B2 | 10/2005 | Karim et al. | |
| 7,122,477 B2 | 10/2006 | Ikeda | |
| 7,141,514 B2 | 11/2006 | Chua | |
| 7,214,628 B2 | 5/2007 | Chua | |
| 7,229,931 B2 | 6/2007 | Mungekar et al. | |
| 2006/0051921 A1* | 3/2006 | Youn et al. | 438/257 |
| 2006/0105114 A1* | 5/2006 | White | 427/569 |
| 2006/0172551 A1* | 8/2006 | Chua | 438/770 |
| 2006/0223315 A1 | 10/2006 | Yokota et al. | |
| 2007/0128880 A1 | 6/2007 | Kitagawa et al. | |
| 2007/0224836 A1 | 9/2007 | Sasaki et al. | |

FOREIGN PATENT DOCUMENTS

| | | |
|---|---|---|
| JP | 5343391 | 12/1993 |
| WO | 2006016642 A1 | 2/2006 |

OTHER PUBLICATIONS

Lim, Kwan-Yong, et al., "Highly Reliable and Scalable Tungsten Polymetal Gate Process for Memory Devices using Low-Temperature Plasma Selective Gate Reoxidation," 2006 Symposium on VLSI Technology Digest of Technical Papers, Jun. 2006.

* cited by examiner

*Primary Examiner*—Dung A. Le
(74) *Attorney, Agent, or Firm*—Moser IP Law Group

(57) ABSTRACT

Methods of fabricating an oxide layer on a semiconductor substrate are provided herein. In some embodiments, a method of forming an oxide layer on a semiconductor substrate includes placing a substrate to be oxidized on a substrate support in a vacuum chamber of a plasma reactor, the chamber having an ion generation region remote from the substrate support; introducing a process gas into the chamber, the process gas comprising at least one of hydrogen ($H_2$) and oxygen ($O_2$)—provided at a flow rate ratio of hydrogen ($H_2$) to oxygen ($O_2$) of up to about 3:1—or water vapor ($H_2O$ vapor); and generating an inductively coupled plasma in the ion generation region of the chamber to form a silicon oxide layer on the substrate.

15 Claims, 3 Drawing Sheets

METHODS FOR LOW TEMPERATURE OXIDATION OF A SEMICONDUCTOR DEVICE

BACKGROUND OF THE INVENTION

1. Field of the Invention

Embodiments of the present invention generally relate to semiconductor fabrication, and more particularly, to oxidation of a semiconductor device or its components.

2. Description of the Related Art

Semiconductor devices require thin oxide layers to be formed at various stages of their fabrication. For example, in transistors, a thin gate oxide layer may be formed as part of a gate stack structure. In addition, in some applications, such as in the fabrication of a flash memory film stack, a thin oxide layer may be formed surrounding the entire gate stack, for example, via exposing the stack to an oxidation process. Such oxidation processes have conventionally been performed either thermally or using a plasma.

Thermal processes for forming oxide layers, for example, the gate oxide layer or the gate stack oxidation layer, have worked relatively well in fabrication of semiconductor devices of the larger feature sizes used in the past. Unfortunately, as feature sizes are becoming much smaller and different oxides are employed in the next generation of advanced technologies, the high wafer temperatures required in thermal oxidation processes are problematic in that the sharp junction definitions which are now required become diffused at the higher temperatures (e.g., above about 700 degrees Celsius). Such a distortion of junction definitions and other features can lead to poor device performance or failure.

Plasma processes used to form oxide layers have similar problems. For example, at high chamber pressure (e.g., 100 mTorr), contaminants tend to accumulate in the gate oxide layer during formation, leading to fatal defects in the gate oxide structure such as dangling bonds or mobile charge, and at low chamber pressure (e.g., tens of mTorr), increased plasma ion energy leads to ion bombardment damage and other diffusion problems.

For example, conventional oxidation processes often result in a defect known as a bird's beak. Bird's beak refers to diffusion of the oxide layer into the layers of the film stack structure from the sides at the interface between adjacent layers, rounding off the corners of the adjacent layers. The resultant defect has a profile that resembles a bird's beak. The intrusion of the oxide layer into the active region of the memory cell (e.g., in flash memory applications) reduces the active width of the memory cell, thereby undesirably reducing the effective width of the cell and degrading the performance of the flash memory device.

Thus, there is a need for an improved method for oxidizing stacks of materials.

SUMMARY

Methods of fabricating an oxide layer on a semiconductor substrate are provided herein. In some embodiments, a method of forming an oxide layer on a semiconductor substrate includes placing a substrate to be oxidized on a substrate support in a vacuum chamber of a plasma reactor, the chamber having an ion generation region remote from the substrate support; introducing a process gas into the chamber, the process gas comprising at least one of hydrogen ($H_2$) and oxygen ($O_2$)—provided at a flow rate ratio of hydrogen ($H_2$) to oxygen ($O_2$) of up to about 3:1—or water vapor ($H_2O$ vapor); and generating an inductively coupled plasma in the ion generation region of the chamber to form a silicon oxide layer on the substrate.

In some embodiments, a method of forming an oxide layer on a semiconductor substrate includes providing a substrate having a film stack formed thereon on a substrate support in a vacuum chamber of a plasma reactor, the chamber having a ion generation region remote from the substrate support; introducing a process gas into the chamber, the process gas comprising at least one of hydrogen ($H_2$) and oxygen ($O_2$)—provided at a flow rate ratio of hydrogen ($H_2$) to oxygen ($O_2$) of up to about 3:1—or water vapor ($H_2O$ vapor); and generating a remote or quasi-remote plasma in the ion generation region of the chamber to form a silicon oxide layer on the film stack.

In some embodiments, a method of forming an oxide layer on a semiconductor substrate includes providing a substrate having a gate film stack formed thereon on a substrate support in a vacuum chamber of a plasma reactor, the chamber having a ion generation region remote from the substrate support; introducing a process gas into the chamber, the process gas comprising at least one of hydrogen ($H_2$) and oxygen ($O_2$)—provided at a flow rate ratio of hydrogen ($H_2$) to oxygen ($O_2$) of up to about 3:1—or water vapor ($H_2O$ vapor); maintaining the substrate at a temperature of less than about 700 degrees Celsius; and generating a remote or quasi-remote plasma in the ion generation region of the chamber to form a silicon oxide layer on the gate film stack.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
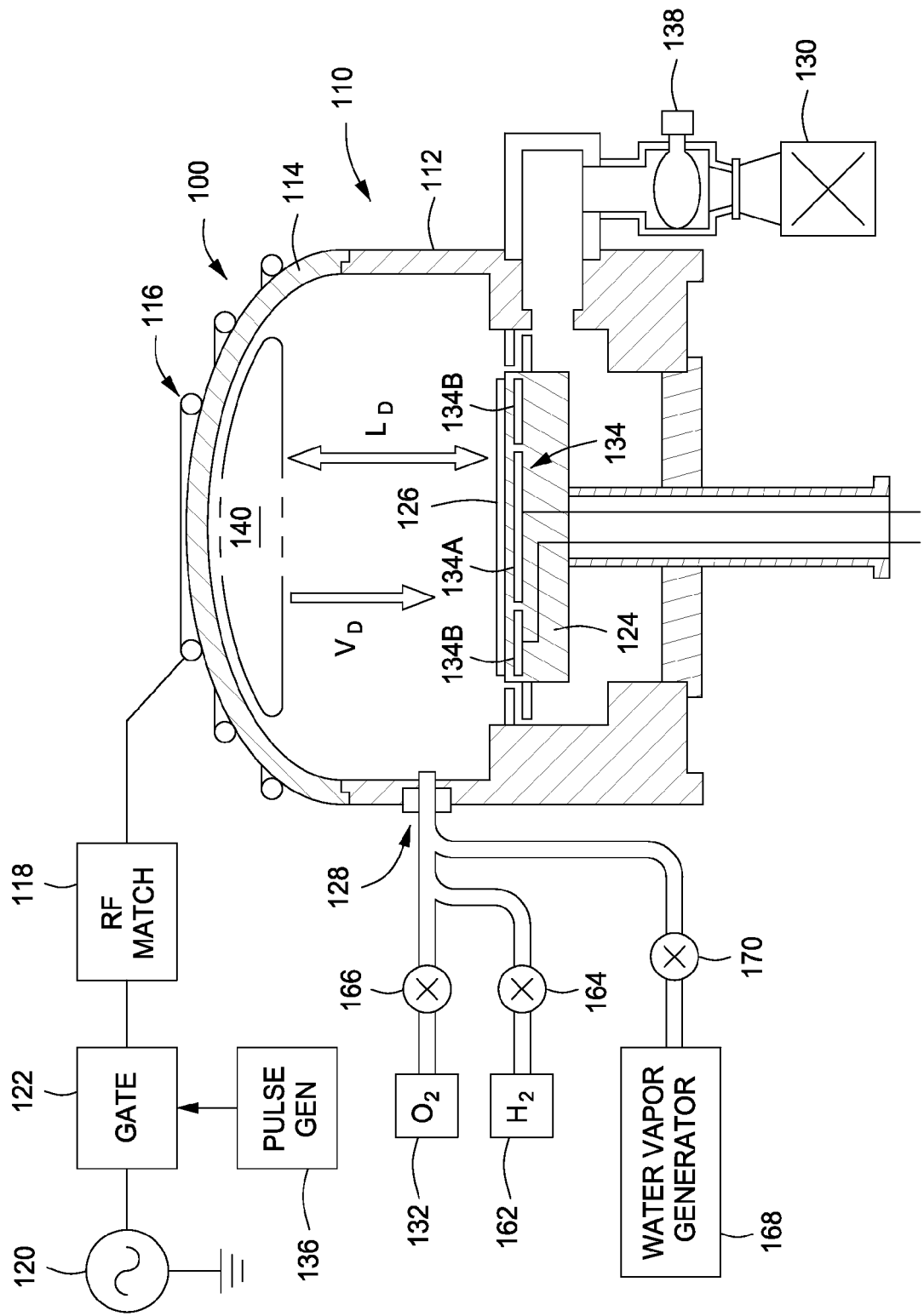
FIG. 1 illustrates a plasma reactor suitable for carrying out embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention provide methods for low temperature oxidation of semiconductor substrates. The inventive processes advantageously provide formation of the oxide layer at lower temperatures, with low impurities, reduced dopant diffusion, and reduced microloading effects.

Embodiments of the present invention may be carried out in suitably equipped plasma reactors, such as Decoupled Plasma Nitridation (DPN) reactors available from Applied Materials, Inc., of Santa Clara, Calif. Other suitable plasma reactors may also be utilized. For example, FIG. 1 depicts an illustrative plasma reactor 100 suitable for carrying out oxide formation processes in accordance with embodiments of the present invention. The reactor 100 may provide a low ion energy plasma via an inductively coupled plasma source power applicator driven by a pulsed or continuous wave (CW) RF power generator. The reactor includes a chamber 110 having a cylindrical side wall 112 and a ceiling 114 which may be either dome-shaped (as shown in the drawing), flat, or other geometry. The plasma source power applicator comprises a coil antenna 116 disposed over the ceiling 114 and coupled through an impedance match network 118 to an RF power source consisting of an RF power generator 120 and a gate 122 at the output of the generator 120 controlled by a pulse signal having a selected duty cycle. The RF power generator 120 is configured to provide power between about 50 watts to about 2500 watts. It is contemplated that other low ion energy producing plasma source power applicators may be utilized as well, such as remote RF or microwave plasma sources.

The reactor 100 further includes a substrate support pedestal 124, such as an electrostatic chuck or other suitable substrate support, for holding a semiconductor substrate 126, for example a 200 or 300 mm semiconductor wafer or the like. The substrate support pedestal 124 typically includes a heating apparatus, such as a heater 134 beneath the top surface of the substrate support pedestal 124. The heater 134 may be a single or multiple zone heater, such as a dual radial zone heater having radially inner and outer heating elements 134a, 134b, as depicted in FIG. 1.

The reactor 100 further includes a gas injection system 128 and a vacuum pump 130 coupled to the interior of the chamber. The gas injection system 128 is supplied to one or more process gas sources, for example, an oxygen container 132, a hydrogen container 162, a water vapor container 168, or the like. Flow control valves 166, 164, 170 respectively coupled to the gas sources (e.g., the oxygen container 132, the hydrogen container 162, and the water vapor container 168) may be utilized to selectively provide process gases or process gas mixtures to the interior of the chamber during processing. Other gas sources (not shown) for providing additional gases, such as inert gases (helium, argon, or the like), gaseous mixtures, or the like, may also be provided. The chamber pressure may be controlled by a throttle valve 138 of the vacuum pump 130.

The duty cycle of the pulsed RF power output at the gate 122 may be controlled by controlling the duty cycle of a pulse generator 136 whose output is coupled to the gate 122. Plasma is generated in an ion generation region 140 corresponding to a volume under the ceiling 114 surrounded by the coil antenna 116. As the plasma is formed in an upper region of the chamber 110 at a distance from the substrate 126, the plasma is referred to as a quasi-remote plasma (e.g., the plasma has benefits of remote plasma formation, but is formed within same process chamber 110 as the substrate 126.) Alternatively, a remote plasma may be utilized, in which case the ion generation region 140 may be disposed outside of the chamber 110.

In operation, the plasma reactor 100 may be employed to carry out oxidation processes in accordance with embodiments of the present invention to deposit high quality oxide layers having reduced defects, such as a very low defect density, reduced bird's beak, and the like. The defects may be reduced by reducing the duty cycle of the pulsed RF plasma. The processes may further be performed at a reduced temperature which limits diffusion, which is a significant advantage for minimizing bird's beak.

Figure 2A:
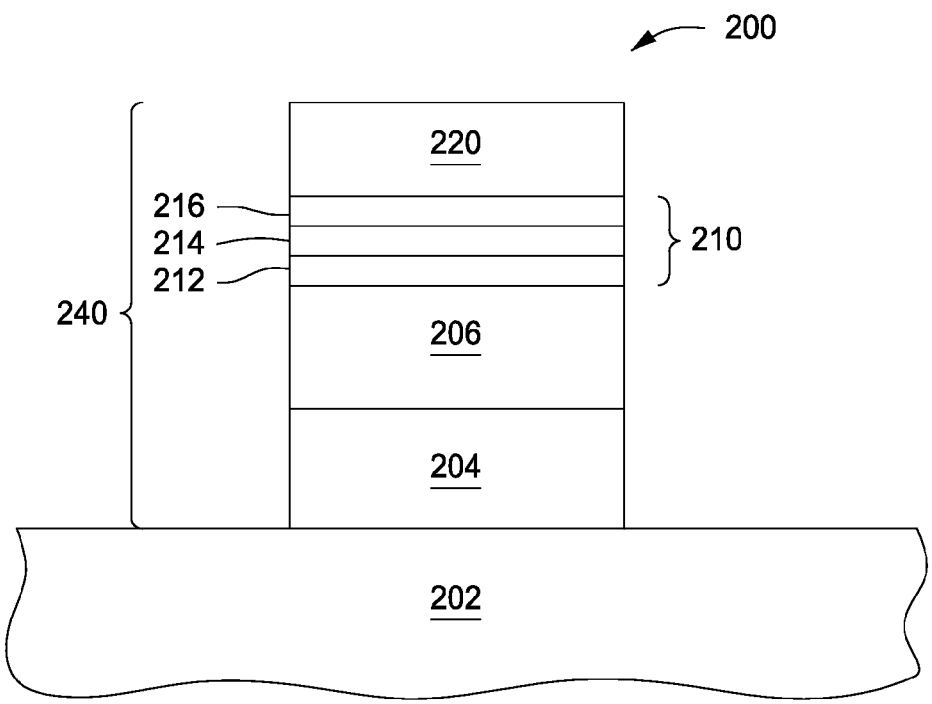
FIGS. 2A-B illustrate stages of fabrication of a semiconductor structure in accordance with some embodiments of the present invention.
Figure 2B:
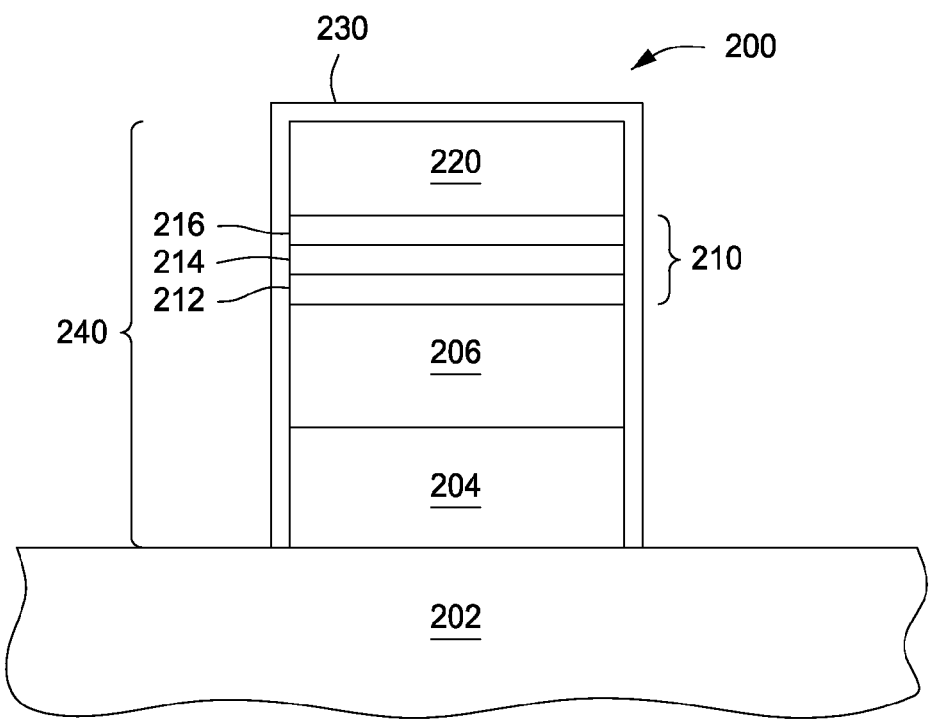
Figure 3:
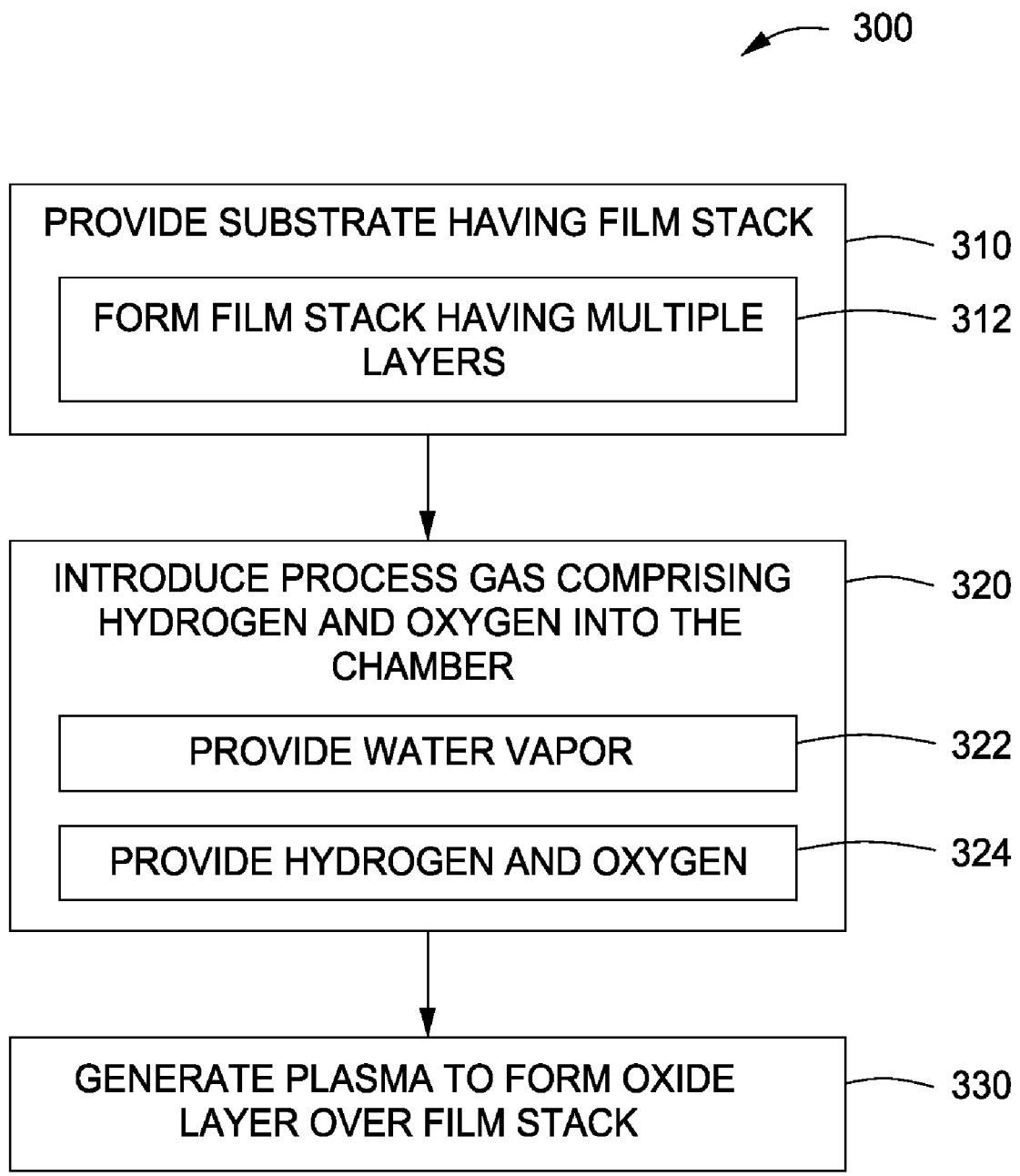
FIG. 3 depicts a flow chart of an oxidation process in accordance with some embodiments of the present invention.

For example, FIGS. 2A-B depict stages of fabrication of a semiconductor structure 200 including a film stack 240 formed over a semiconductor substrate 202. FIG. 3 depicts an illustrative process 300 for forming an oxide layer in accordance with embodiments of the present invention. The process 300 is described herein with respect to the structure depicted in FIGS. 2A-B and may be performed, for example, in the reactor 100 described above with respect to FIG. 1.

The process 300 begins at 310, where a substrate 202 is provided having a film stack 200 to be oxidized disposed thereupon. The substrate 202 generally corresponds to the substrate 126 of FIG. 1 and is generally supported on the substrate support 124 in the chamber 110 of the plasma reactor 100. The substrate 202 may have various dimensions, such as 200 or 300 mm diameter wafers, as well as rectangular or square panels. In some embodiments, the film stack 202 may be formed upon the substrate 202 at 312 and then provided to the chamber 110 for the oxidation process. For example, the film stack 202 may be fabricated in one or more process chambers coupled to a cluster tool that also has the plasma reactor 100 coupled thereto. One example of a suitable cluster tool is a Gate Stack CENTURA®, available from Applied Materials, Inc., of Santa Clara, Calif.

The substrate 202 may comprise a material such as crystalline silicon (e.g., Si<100> or Si<111>), silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, or the like.

The stack 200 may be any stack of materials to be oxidized where a reduction in bird's beak or other plasma-induced substrate damage is desired. For example, in some embodiments, such as in flash memory applications, the stack 200 may be a gate stack of a flash memory cell comprising a tunnel oxide layer 204, a floating gate layer 206, a single or multi-layer dielectric layer comprising the Interpoly Dielectric (IPD) 210 (a non-limiting example of the IPD is a multi-layer ONO layer comprising an oxide layer 212, a nitride layer 214, and an oxide layer 216 is illustratively shown in FIGS. 2A-B), and a control gate layer 220. The oxide layers 204, 212, 216 typically comprise silicon and oxygen, such as silicon oxide ($SiO_2$), silicon oxynitride (SiON), or the like. The nitride layer 214 typically comprises silicon and nitrogen, such as silicon nitride (SiN), or the like. In some embodiments, a multi-layer comprising $SiO_2/Al_2O_3/SiO_2$ can also be used as the IPD layer 210. The floating gate layer 206 and the control gate layer 220 typically comprises a conductive material, such as polysilicon, metals, or the like. It is contemplated that film stacks in other applications may be advantageously oxidized in accordance with the teachings provided herein, such as dynamic random access memory (DRAM) metal electrode/polysilicon gate stacks, Charge Trap Flash (CTF) for Non-volatile Memory (NVM), or the like. The DRAM metal electrode is typically tungsten (W) with interlayers of titanium nitride (TiN) or tungsten nitride (WN) between the tungsten and polysilicon layers. Charge Trap Flash (CTF) for Non-volatile Memory (NVM) uses a $SiO_2/SiN/Al_2O_3$ gate stack with a metal electrode of tantalum nitride (TaN) or titanium nitride (TiN) that may also benefit from sidewall oxidation after gate etch.

Next, at 320, a process gas comprising hydrogen and oxygen are provided to the chamber 110. In some embodiments, the process gas provided at 320 includes oxygen ($O_2$) and hydrogen ($H_2$), as indicated at 324. In some embodiments, the hydrogen ($H_2$) may be less than about 90 percent, or up to about 75 percent of the total amount of oxygen ($O_2$) and hydrogen ($H_2$) provided. In some embodiments, the hydrogen ($H_2$) may be between about 25 to 75 percent of the total amount of oxygen ($O_2$) and hydrogen ($H_2$) provided (e.g., a flow rate ratio of hydrogen ($H_2$) to oxygen ($O_2$) of between about 1:3-3:1). It has been discovered by the inventors that addition of hydrogen ($H_2$) to the oxygen ($O_2$) can increase the thickness of a silicon oxide film by up to about 20 percent, as compared to similar processes using oxygen ($O_2$) alone.

In some embodiments, the process gas may include water vapor, as indicated at 322. In embodiments where water vapor is provided, the water vapor may be mixed with at least one of hydrogen and/or oxygen gas. Alternatively or in combination, the water vapor may be mixed with at least one inert gas, such as helium (He), argon (Ar), krypton (Kr), neon (Ne), or the like.

In some embodiments, the process gas (or gas mixture) may be provided at total flow rate of between about 100-2000 sccm, or at about 400 sccm. For example, in embodiments where both oxygen ($O_2$) and hydrogen ($H_2$) are provided, the oxygen ($O_2$) and hydrogen ($H_2$) may be provided in a total flow rate of between about 100-2000 sccm, or at about 400 sccm, in the percentage ranges described above. In embodiments where water vapor is provided, the water vapor may be introduced at a flow rate of between about 5-1000 sccm with one or more inert carrier gases. The inert gases may be provided as necessary to provide a total flow rate of between about 100-2000 sccm and to provide a process gas mixture having up to about 50 percent water vapor. Inert gas additions may also be used with the $H_2/O_2$ mixture to prevent recombination of the ionized oxygen and/or hydrogen. Excited diatomic molecules typically like to recombine with themselves in a plasma, so the addition of inert gases (such as Ar, He, Kr, Ne, or the like) may facilitate higher oxidation rates.

Next, at 330, a plasma is generated from the process gases within the chamber 110 to form an oxide layer 230 over the film stack 200. The plasma is formed in the ion generation region 140 of the chamber 110 via inductive coupling of RF energy from the coil antenna 116 disposed over the ceiling 114, thereby advantageously providing a low ion energy (e.g., less than about 5 eV for pulsed plasmas and less than 15 eV for CW plasmas). The low ion energy of the plasma limits ion bombardment damage and facilitates oxidation of the sidewalls of the stack 200 while limiting diffusion of oxygen between the layers thereof, thereby reducing bird's beak.

In some embodiments, about 25 to 5000 watts of power may be provided to the coil antenna 116 at a suitable frequency to form a plasma (for example, in the MHz or GHz range, or about 13.56 MHz or greater). The power may be provided in a continuous wave or pulsed mode with duty cycles of between about 2 to 70 percent.

For example, in some embodiments, the plasma may be generated during successive "on" times, and ion energy of the plasma allowed to decay during successive "off" intervals. The "off" intervals separate successive "on" intervals and the "on" and "off" intervals define a controllable duty cycle. The duty cycle limits kinetic ion energy at the surface of the substrate below a pre-determined threshold energy. In some embodiments, the pre-determined threshold energy is at or below about 5 eV.

For example, during the "on" time of the pulsed RF power, the plasma energy increases and during the "off" time it decreases. During the short "on" time, the plasma is generated in the ion generation region 140 loosely corresponding to the volume enclosed by the coil antenna 116. The ion generation region 140 is elevated a significant distance $L_D$ above the substrate 126. Plasma generated in the ion generation region 140 near the ceiling 114 during the "on" time drifts at an average velocity $V_D$ toward the substrate 126 during the "off" time. During each "off" time, the fastest electrons diffuse to the chamber walls, allowing the plasma to cool. The most energetic electrons diffuse to the chamber walls at a much faster velocity than the plasma ion drift velocity $V_D$. Therefore, during the "off" time, the plasma ion energy decreases significantly before the ions reach the substrate 126. During the next "on" time, more plasma is produced in the ion generation region 140, and the entire cycle repeats itself. As a result, the energy of the plasma ions reaching the substrate 126 is significantly reduced. At the lower range of chamber pressure, namely around 10 mT and below, the plasma energy of the pulsed RF case is greatly reduced from that of the continuous RF case.

The "off" time of the pulsed RF power waveform and the distance $L_D$ between the ion generation region 140 and the substrate 126 must both be sufficient to allow plasma generated in the ion generation region 140 to lose a sufficient amount of its energy so that it causes little or no ion bombardment damage or defects upon reaching the substrate 126. Specifically, the "off" time is defined by a pulse frequency between about 2 and 20 kHz, or at about 10 kHz, and an "on" duty cycle between about 5% and 20%. Thus, in some embodiments, the "on" interval may last between about 5-50 microseconds, or about 20 microseconds and the "off" interval may last between about 50-95 microseconds, or about 80 microseconds.

In some embodiments, the ion generation region-to-substrate distance $L_D$ is greater than about 2 cm, or between about 2-20 cm. The ion generation region-to-substrate distance $L_D$ can be about the same as (or greater than) the distance $V_D$ times the "off" time traveled by the plasma ions during a single "off" time of the pulsed RF power waveform.

In both the continuous wave and the pulsed mode, the plasma generated at 330 advantageously balances the cogeneration of oxygen and hydrogen ions within the chamber and close enough to the substrate to limit the loss of reactivity of the ions with control of the ion energy to prevent ion bombardment induced damage or diffusion damage (e.g., bird's beak).

The plasma generated at 330 may be formed in a low pressure process, thereby reducing the likelihood of contamination induced defects. For example, in some embodiments, the chamber 110 may be maintained at a pressure of between about 1-500 mTorr. Moreover, ion bombardment-induced defects that would be expected at such a low chamber pressure levels may be limited or prevented by using the quasi-remote plasma source and, optionally, by pulsing the plasma source power as described above.

The substrate may be maintained at about room temperature (about 22 degrees Celsius), or at a temperature of between about 20-750 degrees Celsius, or less than about 700 degrees Celsius, or less than about 600 degrees Celsius. The low temperature of the process reduces the ion energy of the plasma constituents, thereby further limiting diffusion of oxygen between the layers of the stack 200 and, thereby further reducing bird's beak.

The oxide layer 230 may be formed to a thickness of between 5-100 Angstroms. The process 300 may provide growth rates of oxide films between about 7-50 Angstroms per minute, or at least about 25 Angstroms per minute. The inventive process 300 disclosed herein provides the oxide growth rate enhancement described above at a lower thermal budget, thereby further limiting diffusion effects by reducing the exposure time of the substrate to the process as compared to conventional oxidation processes. In some embodiments, the process may have a duration of between about 5-300 seconds.

Upon forming the oxide layer 310 to a desired thickness over the film stack 200, the process 300 ends. The substrate 202 may be subsequently further processed as necessary to complete the structures being fabricated thereon.

Thus, embodiments of processes for forming an oxide layer on a substrate, or on a film stack disposed thereon, have been provided herein. The processes advantageously provide formation of the oxide layer at lower temperatures, with low impurities, reduced dopant diffusion, and reduced microloading effects. Thus, the present inventive processes facilitate a larger process window and increased types of processes that may be used prior to the oxidation step. For example, the use of lower temperature during the oxidation process is advantageous as it will not cause instability in film structures formed prior to the oxidation step, oxidation of metallic electrodes on a gate stack, or dopant diffusion issues for processing steps carried out, prior to the oxidation step. The large process window ensures the growth of a high quality oxide film at low temperature and free of defects induced by contamination or ion bombardment damage or diffusion.

Although the present invention is illustrated above with reference to a flash memory film stack, the present invention can also be used to advantage to oxidize other transistor gate stacks, other material stacks, or to form oxide layers on substrates in various other applications.

While the foregoing is directed to embodiments of the present invention, other and further embodiments of the invention may be devised without departing from the basic scope thereof, and the scope thereof is determined by the claims that follow.

The invention claimed is:

1. A method of forming an oxide layer on a semiconductor substrate, comprising:
   placing a substrate to be oxidized on a substrate support in a vacuum chamber of a plasma reactor, the chamber having an ion generation region remote from the substrate support;
   introducing a process gas into the chamber, the process gas comprising hydrogen ($H_2$), oxygen ($O_2$), and water vapor ($H_2O$ vapor); and
   generating an inductively coupled plasma in the ion generation region of the chamber to form a silicon oxide layer on the substrate.

2. The method of claim 1, wherein the substrate further comprises:
   a film stack comprising a plurality of layers, and wherein the silicon oxide layer is formed on the stack.

3. The method of claim 2, wherein the film stack comprises gate stack having an oxide layer formed therein.

4. The method of claim 1, wherein the process gas further comprises at least one inert gas.

5. The method of claim 1, further comprising maintaining the substrate below about 700 degrees Celsius.

6. The method of claim 1, further comprising maintaining the substrate below about 600 degrees Celsius.

7. The method of claim 1, wherein the pressure in the chamber is maintained between about 5-500 mTorr.

8. The method of claim 1, wherein the silicon oxide film has a growth rate of about 7-50 Angstroms/minute.

9. The method of claim 1, wherein generating an inductively coupled plasma further comprises:
   providing pulsed plasma source power.

10. The method of claim 9, further comprising:
    pulsing the plasma source power at a pulse frequency of about 5-20 kHz.

11. The method of claim 9, further comprising:
    providing pulsed plasma source power having a duty cycle of about 2-70 percent.

12. The method of claim 1, wherein the ion generation region is disposed between about 2-20 cm from the substrate support.

13. The method of claim 1, wherein the process gas comprises hydrogen ($H_2$) and oxygen ($O_2$) provided at a flow rate ratio of between about 1:3 and 3:1.

14. The method of claim 1, wherein the process gas comprises hydrogen ($H_2$) and oxygen ($O_2$) provided at a flow rate ratio of hydrogen ($H_2$) to oxygen ($O_2$) of up to about 3:1.

15. The method of claim 1, wherein the plasma has an ion energy of less than about 15 eV.

* * * * *